(12) United States Patent
De Wolf et al.

(10) Patent No.: US 8,294,976 B1
(45) Date of Patent: Oct. 23, 2012

(54) METHOD FOR REDUCING SUBSTRATE CHARGING

(75) Inventors: Ingrid De Wolf, Leuven (BE); Xavier Rottenberg, Schaarbeek (BE); Piotr Czarnecki, Leuven (BE); Philippe Soussan, Marseilles (FR)

(73) Assignees: IMEC, Leuven (BE); Katholieke Universiteit Leuven, K.U. Leuven R&D, Leuven (BE)

( * ) Notice: Subject to any disclaimer, the term of this patent is extended or adjusted under 35 U.S.C. 154(b) by 561 days.

(21) Appl. No.: 12/415,937

(22) Filed: Mar. 31, 2009

Related U.S. Application Data (60) Provisional application No. 61/041,064, filed on Mar. 31, 2008.

(51) Int. Cl.
*G02B 26/00* (2006.01)
(52) U.S. Cl. .................................... 359/290; 359/291
(58) Field of Classification Search ............... 359/223.1, 359/224.1, 290; 438/52
See application file for complete search history.

(56) References Cited

U.S. PATENT DOCUMENTS

| | | | |
|---|---|---|---|
| 6,191,671 B1 | 2/2001 | Schlaak et al. | |
| 2004/0188785 A1* | 9/2004 | Cunningham et al. | 257/415 |
| 2004/0222074 A1 | 11/2004 | Bouche et al. | |
| 2007/0091406 A1* | 4/2007 | Filhol et al. | 359/210 |

FOREIGN PATENT DOCUMENTS

| EP | 1398811 | 3/2004 |
|---|---|---|

OTHER PUBLICATIONS

Czarnecki P. et al., "Influence of the Substrate on the Lifetime of Capacitive RF MEMS Switches," 2008 21st IEEE International Conference on Micro Electro Mechanical Systems—MEMS 2008, 172-175 (Jan. 1, 2008).
European Search Report for EP Application No. 09156532 dated Dec. 16, 2009.
Rottenberg et al., "An electrostatic fringing-field actuator (EFFA): application towards a low-complexity thin-film RF-MEMS technology," J. Micromech. Microeng., 17:S204-S210 (2007).
Rottenberg et al., "Analytical Model of the DC Actuation of Electrostatic MEMS Devices With Distributed Dielectric Charging and Nonplanar Electrodes," Journal of Microelectromechanical Systems, 16(5):1243-1253 (2007).

* cited by examiner

*Primary Examiner* — Scott J Sugarman
*Assistant Examiner* — Mahidere Sahle
(74) *Attorney, Agent, or Firm* — McDonnell Boehnen Hulbert & Berghoff LLP (57) ABSTRACT

An electrostatically actuatable micro electromechanical device is provided with enhanced reliability and lifetime. The electrostatically actuatable micro electromechanical device comprises: a substrate, a first conductor fixed to the top layer of the substrate, forming a fixed electrode, a second conductor fixed to the top layer of the substrate, and a substrate area. The second conductor is electrically isolated from the first conductor and comprises a moveable portion, suspended at a predetermined distance above the first conductor, the moveable portion forming a moveable electrode which approaches the fixed electrode upon applying an actuation voltage between the first and second conductors. The selected substrate surface area is defined as the orthogonal projection of the moveable portion on the substrate between the first and second conductors. In the substrate surface area at least one recess is provided in at least the top layer of the substrate.

14 Claims, 13 Drawing Sheets

| Position | Wafer 06 (μm) | Wafer 07 (μm) |
|---|---|---|
| 1 | 2.1566 | 2.3558 |
| 2 | 1.2370 | 1.4835 |
| 3 | 1.2695 | 1.1688 |
| 4 | 1.4988 | 1.3581 |
| 5 | 1.7082 | 2.1154 |
| min | 1.237 | 1.169 |
| max | 2.157 | 2.356 |
| average | 1.574 | 1.696 |
| unif | 29.21 % | 34.98 % |

Fig. 9

METHOD FOR REDUCING SUBSTRATE CHARGING

BACKGROUND

The present disclosure relates to an electrostatically actuatable MEMS device.

Dielectric charging is recognized as a major reliability issue of electrostatic RF-MEMS (capacitive) devices, e.g. capacitive switches or varicaps, and in general electrostatic MEMS devices. Charges trapped in the dielectric interposer of typical parallel-plate actuators result in shifts and deformations of the ideal actuation characteristics, e.g. C-V profile, as described in X. Rottenberg, I. De Wolf, B. Nauwelaers, W. De Raedt, H. Tilmans, *Analytical model of the DC-actuation of electrostatic MEMS devices with distributed dielectric charging and non-planar electrodes*, Journal of Microelectromechanical Systems, Vol. 16 (5), pp. 1243-1253, 2007. In the past years it has been shown that substrate charging also plays an important role in defining the reliability of these devices, see X. Rottenberg, S. Brebels, P. Ekkels, P. Czarnecki, P. Nolmans, R. Mertens, B. Nauwelaers, B. Puers, I. De Wolf, W. De Raedt, H. Tilmans, *An electrostatic fringing-field actuator (EFFA): application towards a low-complexity thin-film RF-MEMS technology*, Journal of Micromechanics and Microengineering, Vol. 17 (7), pp. S204-S210, 2007, and P. Czarnecki, X. Rottenberg, P. Soussan, P. Ekkels, P. Muller, P. Nolmans, W. De Raedt, H. A. C. Tilmans, R. Puers, L. Marchand and I. De Wolf, "Influence of the substrate on the lifetime of capacitive RF MEMS switches", *Proc. IEEE Int. Conf. Micro Electro Mechanical Syst. MEMS*, January 2008, Tucson, Ariz., USA, pp. 172-175.

Indeed, the substrates used for electrostatic thin-film MEMS processes are either insulating or coated with insulating materials and therefore sensitive to charges. Even though the major part of the electric field used for the actuation is usually confined to the air gap in the structure (between bridge and dielectric interposer), the substrate is also subjected to an electric stress that drives its parasitic charging. As a conclusion, it can be stated that two insulating layers influence the lifetime of typical electrostatic (RF) MEMS devices, namely the dielectric interposer and the substrate. These dielectric and charging mechanism disparities can be seen as the source for the non-uniform effective dielectric charging postulated in X. Rottenberg, I. De Wolf, B. Nauwelaers, W. De Raedt, H. Tilmans, *Analytical model of the DC-actuation of electrostatic MEMS devices with distributed dielectric charging and non-planar electrodes*, Journal of Microelectromechanical Systems, Vol. 16 (5), pp. 1243-1253, 2007.

Over time, these electrical charges may increase to such a level that prevents the MEMS device from returning to its steady-state position after the actuation signal is removed. That is, the MEMS device stays in its actuated position and the MEMS device fails.

In the prior art, patent application US 2006/0276015 presents a method and apparatus for reducing dielectric charging in MEMS structures. The application provides a semiconductor device which comprises a combination of a doped semiconductor layer and an insulation layer. This combination operates to provide a path to dissipate any excess electrical charge received by the insulation layer.

SUMMARY

A micro electromechanical device according to this disclosure is electrostatically actuatable and comprises a substrate, a first and a second conductor. At least a top layer of the substrate comprises a dielectric material. The first conductor is fixed to the top layer of the substrate and forms a fixed electrode of the MEMS device. The second conductor is also fixed to the top layer of the substrate and is electrically isolated from the first conductor. A moveable electrode is electrically connected to the second conductor and is suspended at a predetermined distance above the first conductor. This moveable electrode of the MEMS device can for example be a bridge, beam or cantilever element. The moveable electrode approaches the fixed electrode upon applying an actuation voltage between the first and second conductors. The moveable electrode may be an integral portion of the second conductor. A substrate surface area is the orthogonal projection of the moveable portion on the substrate between the first and the second conductors. At least one recess is provided in at least the top layer of this substrate surface area. The recess(es) is/are provided, by removing or etching away part of the substrate in the substrate surface area.

Although the invention is not limited to any particular theory of operation, the presence of the recess is believed to lower the charging because of a reduced electrostatic stress, e.g. it increases the travelling distance of parasitic current between the first and second conductors via the substrate, which may reduce substrate charging. In addition, the presence of the recess locally increases the gap between the substrate surface and the moveable portion of the second conductor, which may reduce the influence of any substrate charging on the moveable portion. These or other processes are believed to result in a way to reduce substrate charging in a micro electromechanical devices as well as its impact on said micro electromechanical devices. As a result, reliability and lifetime of these devices can be enhanced.

In preferred embodiments, each recess spans at least the entire width of the substrate surface area. Further, each recess preferably extends on opposite sides of the substrate surface area up to a second distance of at least the length of the substrate surface area, the length being measured as the distance between the first and second conductors. These features may further reduce substrate charging and its impact on the moveable portion.

In preferred embodiments, the moveable portion extends at a height above the top layer of the substrate and each recess has a depth of at least this height. These features may further reduce substrate charging and its impact on the moveable portion.

As mentioned above, the recess(es) is/are provided, by removing or etching away part of the substrate in the substrate surface area. Part of the first and second conductors can conveniently be used as the mask for this etching process.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Figure 1:
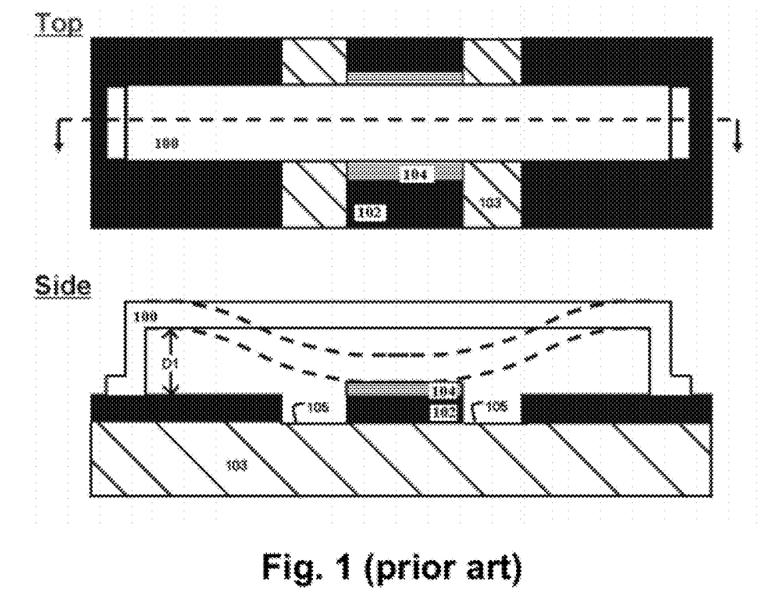
FIGS. 1 and 2 show typical RF-MEMS capacitive switches.
Figure 2:
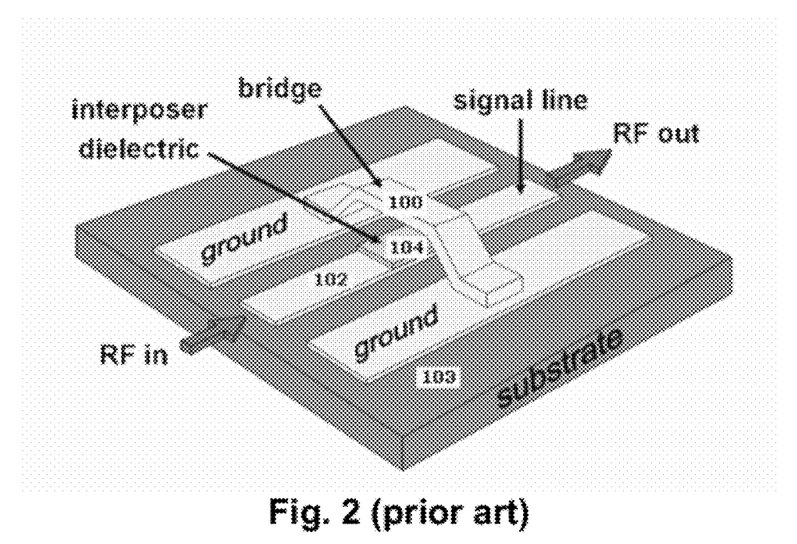

Conventional MEMS devices typically include an insulating layer, e.g. SiN, SiO, TaO, AlO, AlN, BCB, PZT, etc., that is formed over at least part of a substrate. A first and a second conductor, e.g. Cu, Al, Pt, Ti, W, Ni, Au, doped Si or SiGe, doped polycrystalline Si or SiGe or the like, are being fixed to the top layer forming a first and a second electrode. Both electrodes are electrically isolated from each other by, for example, an air gap, vacuum, water, $N_2$, oil and/or by a continuous or patterned dielectric layer on top of the first electrode (the interposer dielectric). One of the electrodes has a moveable portion, forming a moveable electrode. In operation, when an actuation voltage is applied between these electrodes, the moveable electrode moves towards the fixed electrode. When they come into contact, electrical shorting is prevented by the interposer dielectric. Each time the device is operated and comes into contact with the interposer dielectric, electrical charge may be trapped into the interposer dielectric layer. In addition, even without contact between the moveable portion of the second electrode and the interposer dielectric, there is an electrical field between the first electrode and the anchor points of the second electrode during operation of the MEMS. This may result in charging in or at the surface of the substrate, or in or at the surface of the dielectric top layer of that substrate, in the slot between the anchor points of the second electrode and the first electrode. Over time, these electrical charges may increase to such a level that the moveable electrode is prevented from returning to its steady-state position after the voltage is removed, and the MEMS device fails. Dielectric charging is a significant reliability issue of electrostatic RF-MEMS (capacitive) devices, such as capacitive switches or varicaps, and in general electrostatic MEMS devices. Charges trapped in the dielectric interposer of typical parallel-plate actuators result in shifts and deformations of the ideal actuation characteristics, such as the C-V profile. Substrate charging has been shown to play an important role in defining the reliability of these devices Displacement in such devices is induced via a micro-actuator for which various actuation mechanisms exist, including electrostatic, electrothermal, piezoelectric and electromagnetic means. An example of an electrostatic capacitive RF-MEMS device is shown in FIG. 1 and FIG. 2. The device shown in FIGS. 1 and 2 comprises a free-standing metal armature 100, or bridge, overlapping with a fixed metal actuation electrode 102. The actuation electrode 102 is covered with a dielectric layer 104 that is contacted upon actuation of the device. RF-MEMS switching devices have just like semiconductor RF switches, two stable states. Switching between the two states is achieved through the mechanical displacement of a freely moveable structural member, being the bridge. A substrate surface area 105 can be described as the orthogonal projection of the moveable portion on the substrate between the first and the second conductors, having a certain length (L) and width (W) (see also FIG. 4).

The majority of RF-MEMS switches rely on electrostatic actuation, which is based on the attractive Coulomb force existing between charges of opposite polarity. Electrostatic drive offers extremely low power consumption, in which power is consumed only during switching (compare a digital inverter stage). Other advantages of using electrostatic actuation are the relatively simple fabrication technology (much simpler compared to for instance electromagnetic excitation), the high degree of compatibility with a standard IC process line, and the ease of integration with planar and micro-strip transmission lines.

To improve the lifetime of electrostatic MEMS devices, the charging of substrate and/or dielectric interposer are to be minimized. Charging of the interposer dielectric can be minimized by using alternative actuation schemes (e.g. bipolar actuation) but this only reduces charging, it does not prevent it. It can also be reduced by increasing the thickness of the dielectric and using dielectrics that are robust against charge trapping. One way to deal with charging of the dielectric interposer is to omit it. Indeed, structures have been proposed implementing variable air gaps but without any contact with a dielectric layer. But all these existing solutions do not solve the charging in or at the surface of the substrate surface area. Therefore, the present disclosure presents a MEMS wherein at least one recess is provided in at least the top layer of the substrate surface area. The recess(es) is/are provided, by removing or etching away part of the substrate in the substrate surface area.

One embodiment of the invention is illustrated by an example of an RF-MEMS switching device, but it is understood that the invention is not limited thereto. The invention is not limited to this example but can be extended to any electrostatic actuated micro electromechanical system (such as a micro-mirror, resonator, comb-driven actuator) wherein substrate/parasitic charges may be trapped. To test whether the substrate charging can be reduced through processing optimization, the $SiO_2$ and part of the Si in the slots between the CPW signal lines (actuation electrode 102) and ground of some selected wafers (wafer 06 and wafer 07, hereafter referred by IO7-008-06 and IO-008-07) were grooved with a reactive ion etch process. Part of the first and second conductors can conveniently be used as the mask for this etching process whereby a recess or slot is created. In this example, as illustrated in FIG. 3, the photo resist that is used to pattern the Al bottom mask—for signal and ground—is left on the wafer after the Al etching. This resist is subsequently used as a mask to etch this $SiO_2$ and Si. In order to avoid plasma damage, the photo resist is stripped by chemical means. One advantage of this method is that it enables one to avoid plasma induced damage and charge creation on the wafer surface. Another advantage of this technique is that there is no additional lithographic process needed to etch the grooves.

Figure 9:
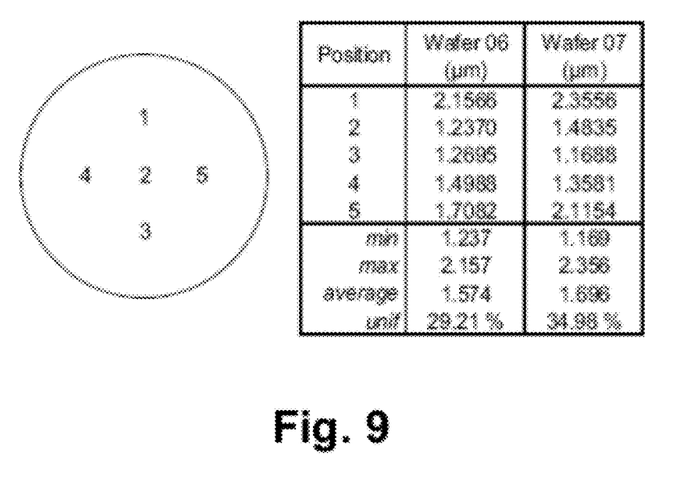
FIG. 9 provides a table illustrating the depth of the slot etched between CPW and ground lines in wafers I07-008-06 and I07-008-07.

The etching was performed in the parallel plate reactive ion etcher: the $SiO_2$ was etched with an $Ar/CF_4$ based plasma and the Si with an $Ar/SF_6$. All the etch processes are performed within the same process chamber. The $Si+SiO_2$ depth was checked with a mechanical profilometer. The resulting depth was approximately 3 μm. The results are listed in FIG. 9, which provides a table illustrating the depth of the slot etched between CPW and ground lines in wafers I07-008-06 and I07-008-07. Specific to this process sample the uniformity of this dry etching is adversely affected due to the loading effect (7" mask on a 8" wafer). The planarization process consist in a two steps process: first the grooves are filled by photo resist spin-coating, and eventually patterned by a lithographical step as shown. Secondly, an additional resist coating is applied to define the sacrificial layer thickness below the membrane of the switch. When the depth of the grooves is varying on the wafer, the overall planarization process is adversely affected accordingly, as shown in this particular process sample.

The result of this method is that the distance between the membrane and the substrate—where charge accumulation plays an important role in the lifetime reduction of the switch—is decoupled from the distance between the membrane and the contact region of the switch, which drives the electrical performance of the device.

Figure 3A:
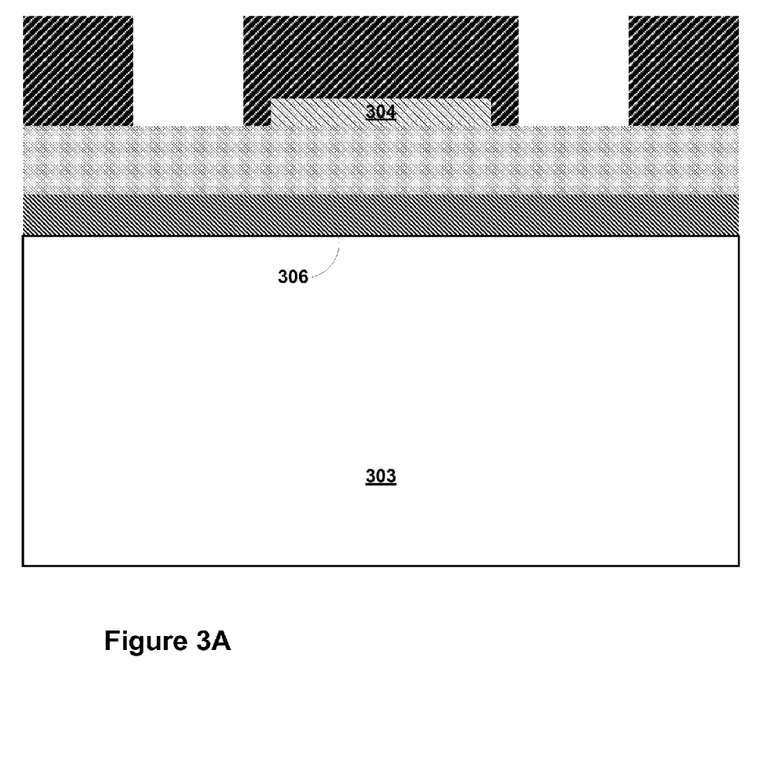
FIGS. 3*a-d* illustrate steps in a slot etching technique described herein.
Figure 3B:
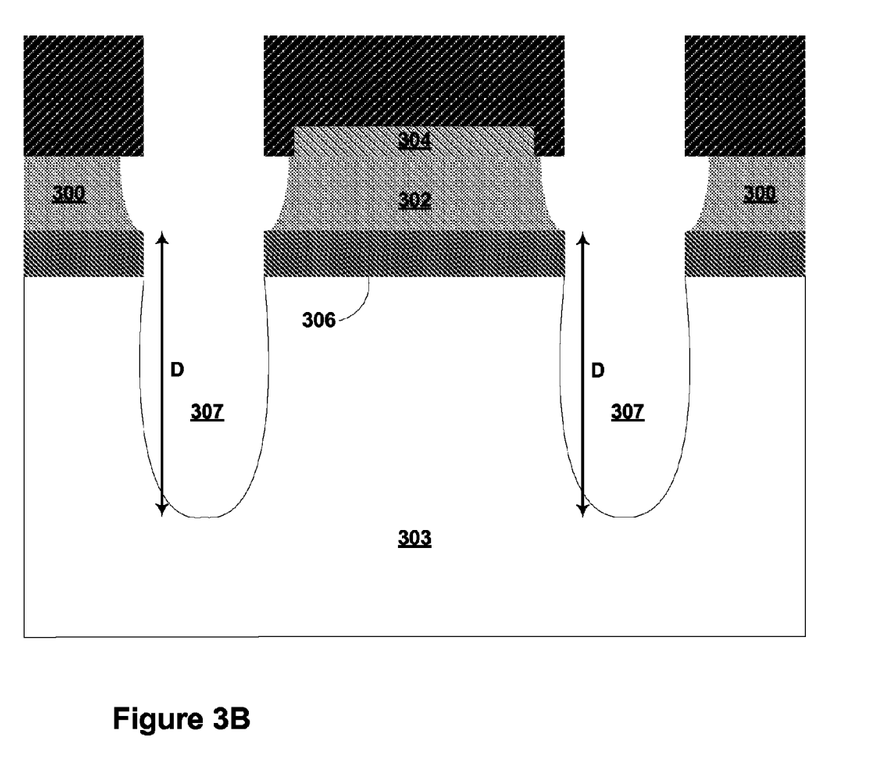
Figure 3C:
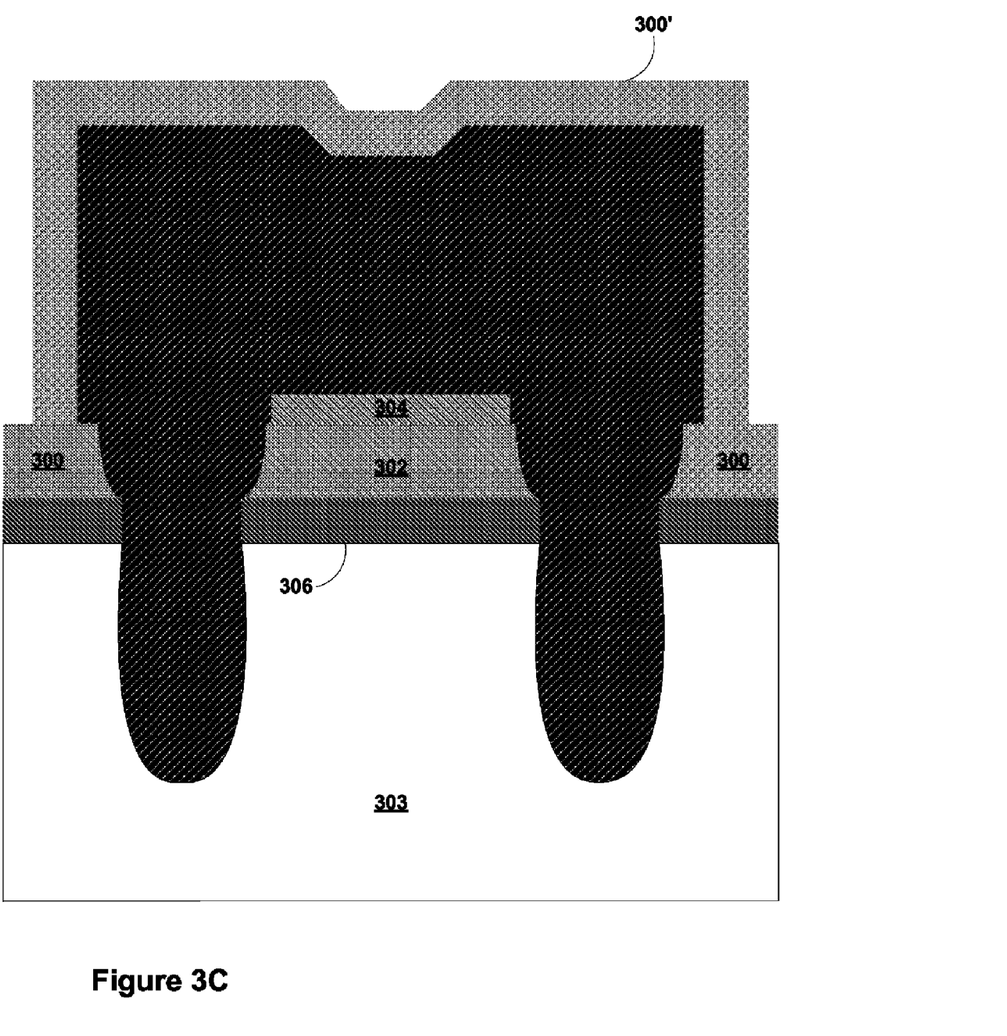
Figure 3D:
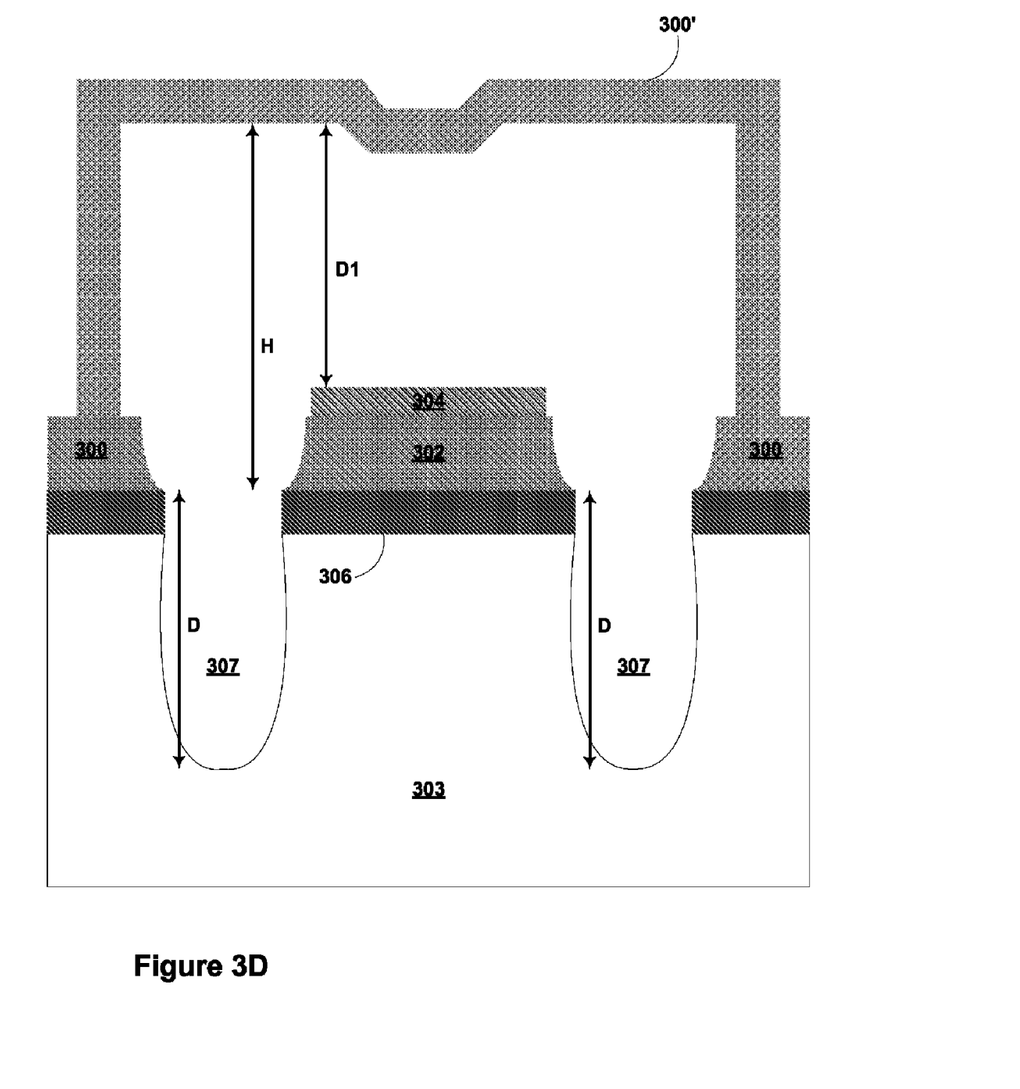
Figure 4:
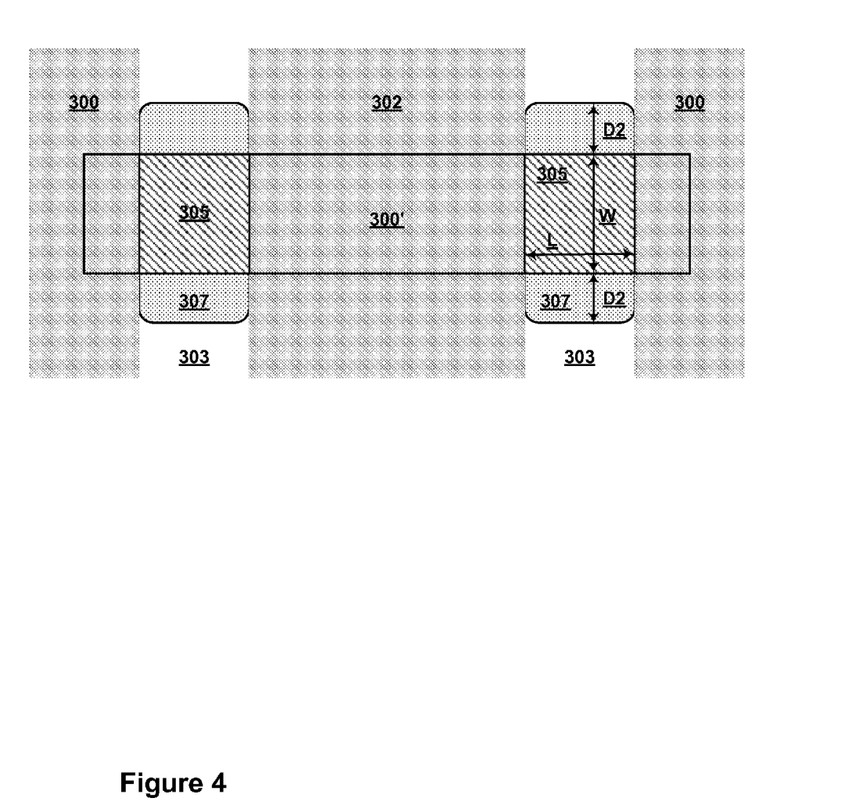
FIG. 4 shows a top view of a device according to one embodiment of the invention, shown in cross-section in FIG. 3*d*.

The outcome of the etching process and planarization process is illustrated in FIG. 3d. An RF-MEMS switch is provided comprising a substrate 303 of which at least a top layer 306 comprises a dielectric material. The bridge 300' is positioned at a predetermined first distance (D1) above the first conductor and extends at a height (H) above the top layer of the substrate. The recess 307 has a depth (D), which is shown to be less than this height (H), but is preferably at least this height (H). FIG. 4 shows a top view of FIG. 3d. The recess 307 spans at least the entire width (W) of the substrate surface area 305. Further, the recess 307, preferably extends on opposite sides of the substrate surface area 305 up to a second distance (D2) of at least the length (L).

In earlier experiments, it was shown that the substrate does charge. This charging does probably take place in the slot between CPW and ground, either in the substrate itself, or in the oxide on top of the Si substrate at that position, or at the surface. The previously presented slot etching technique was performed on a wafer and this wafer was tested.

Figure 5:
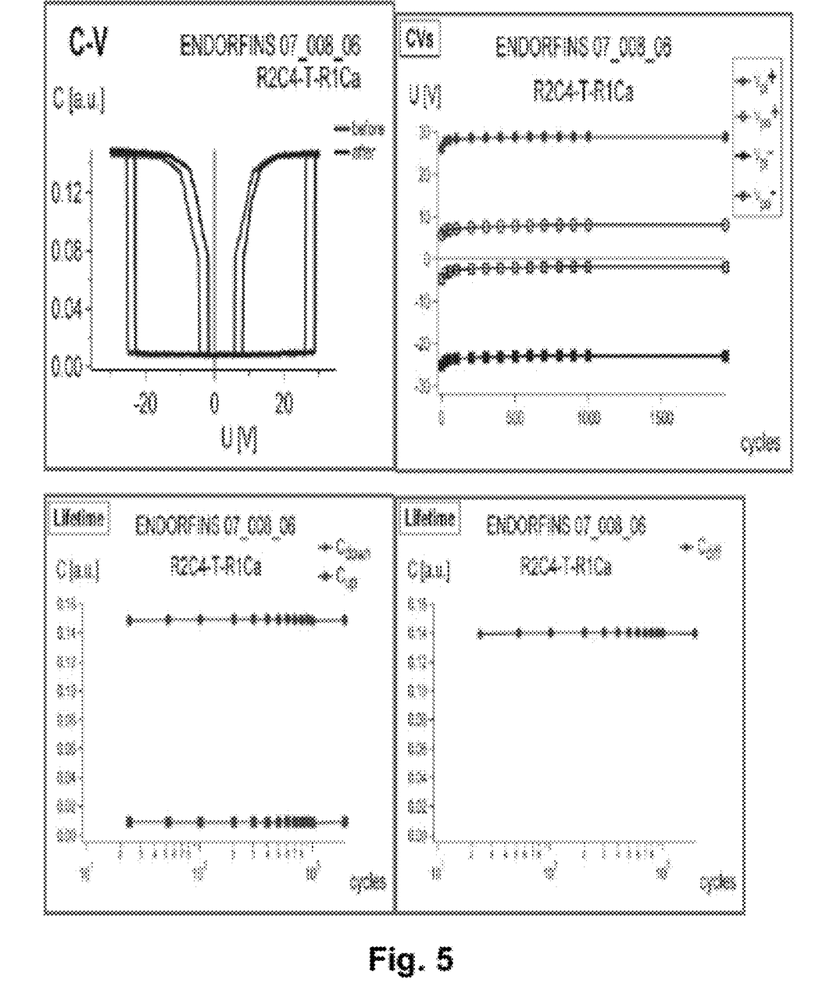
FIG. 5 plots the lifetime test results of a specific wafer.
Figure 6:
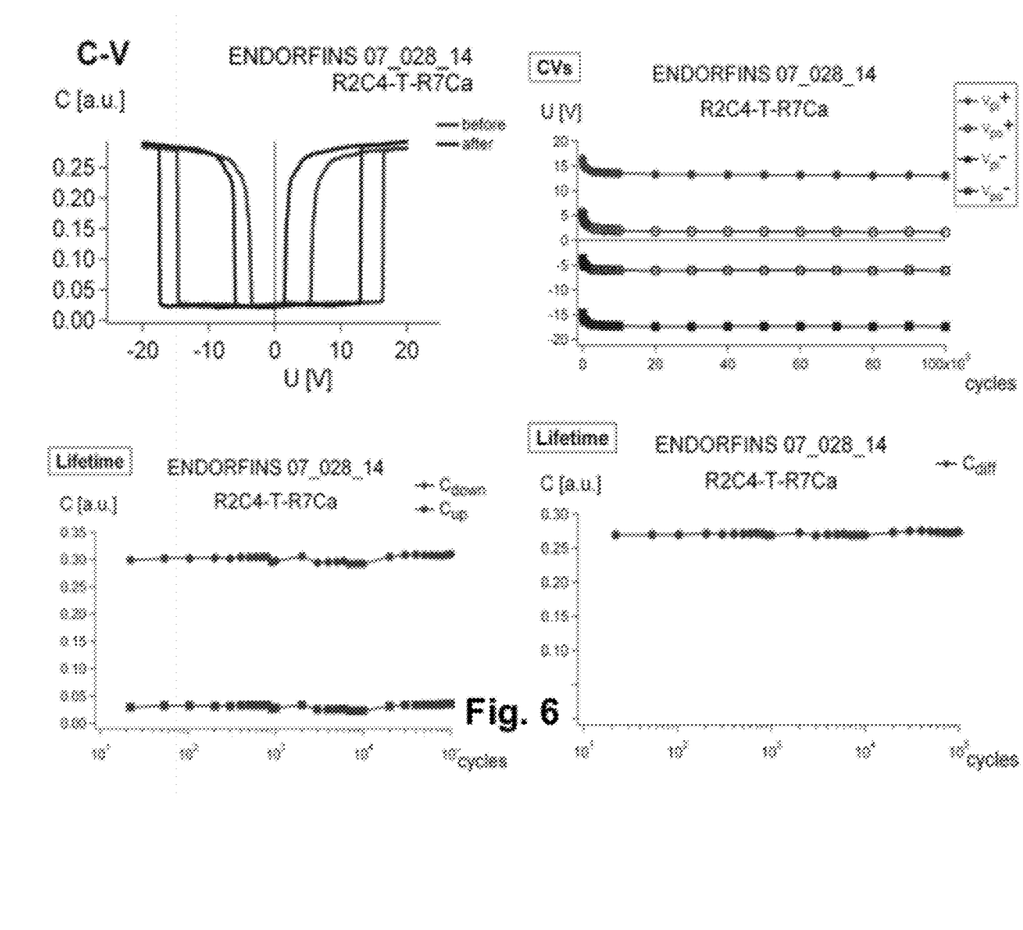
FIG. 6 plots the lifetime test results of a specific wafer.

FIG. 5 shows results of CV measurements (performed with a dedicated ELT (electrical lifetime test) system) and a lifetime test on a first wafer with recessed (etched) slots, using positive unipolar actuation (+30V), 100 Hz, 50% duty cycle. C, as measured by the ELT system, is not the exact value of the capacitance but is proportional to the real capacitance of the MEMS. There is an initial fast small positive shift followed by a slower positive shift of the CV curve. And there is no narrowing of the CV curves. This indicates the presence of negative charging, most likely in the interposer dielectric. In FIG. 6 we show for comparison the results of a similar experiment performed on a similar wafer but without recessed slots. The CV curves show a negative shift and narrowing, both due to substrate charging. These effects are not present in the wafer with recessed slots (FIG. 5), because the recesses prevented substrate charging.

This experiment illustrates that there is nearly no narrowing, that is, substrate charging has been reduced or eliminated, or at least its impact on the bridge 100' is reduced (FIG. 5). The experiment also illustrates that without these recesses, there is indeed substantial charging taking place in the slots (FIG. 6).

Figure 7A:
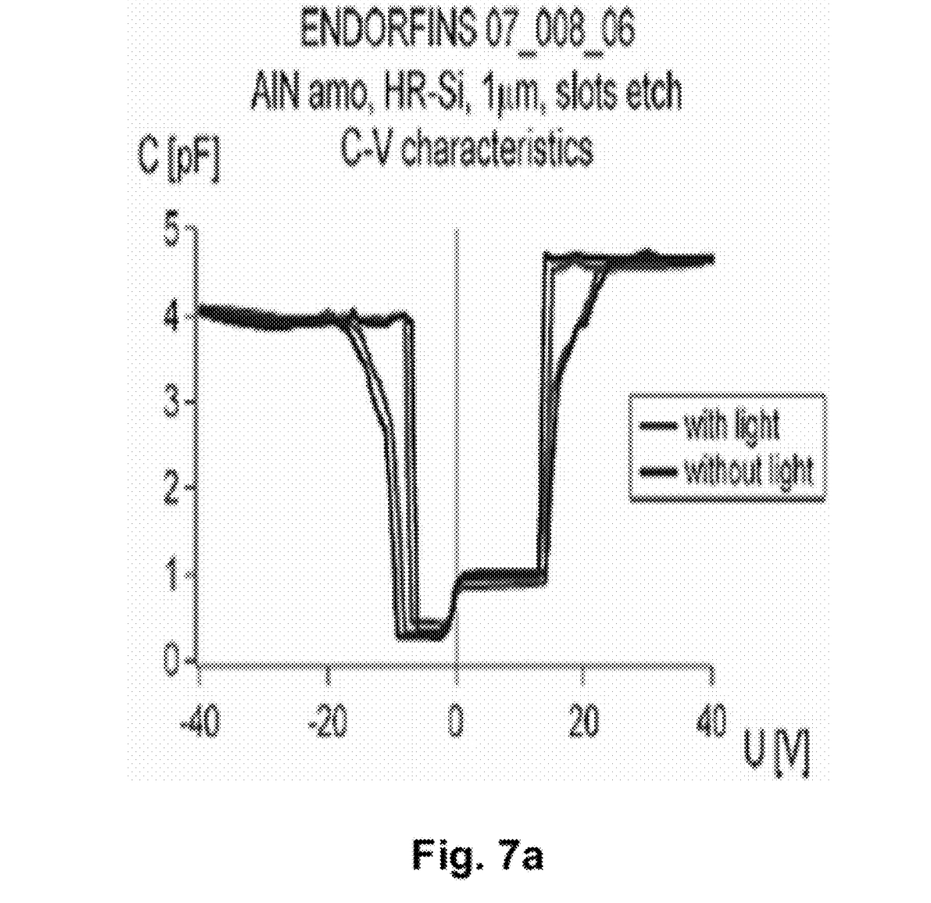
FIGS. 7*a-b* plot C-V measurements on wafers with and without slot etched between CPW and ground.
Figure 7B:
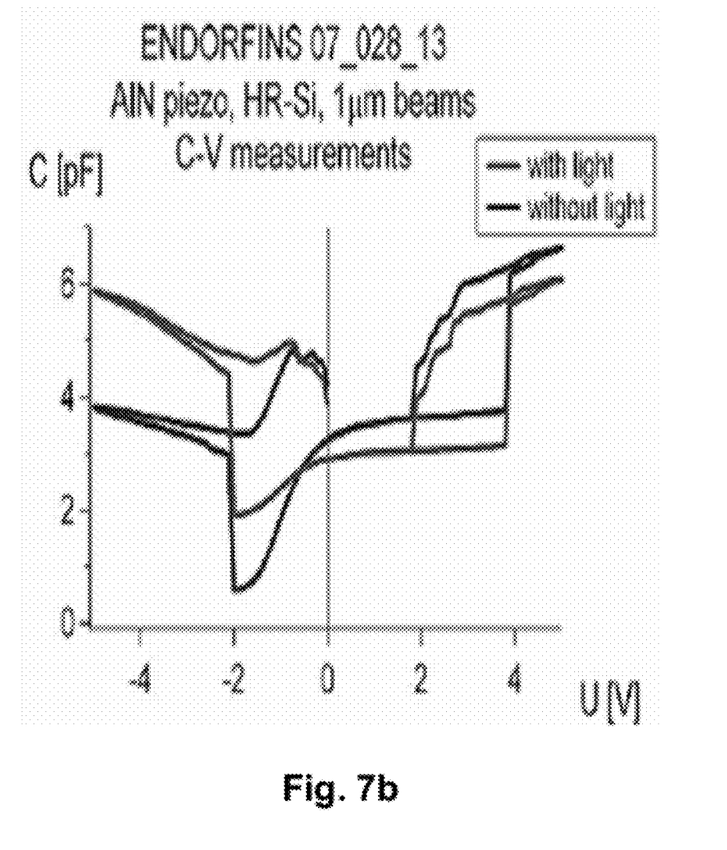

FIG. 7 shows real C-V measurements on wafers with and without etched slot, with and without light. They clearly confirm the large influence of the substrate when there is no slot: light, generating electron-hole pairs in the n-type substrate, affects the CV in that case much more.

The first test results using wafers with an etched slot confirm that substrate charging is reduced by the slots. There is much less narrowing of the C-V curves and the charging is only in the dielectric (negative charging). This indicates that a very good lifetime will be obtained when actuating with a lower voltage and when using a thicker dielectric.

Figure 8A:
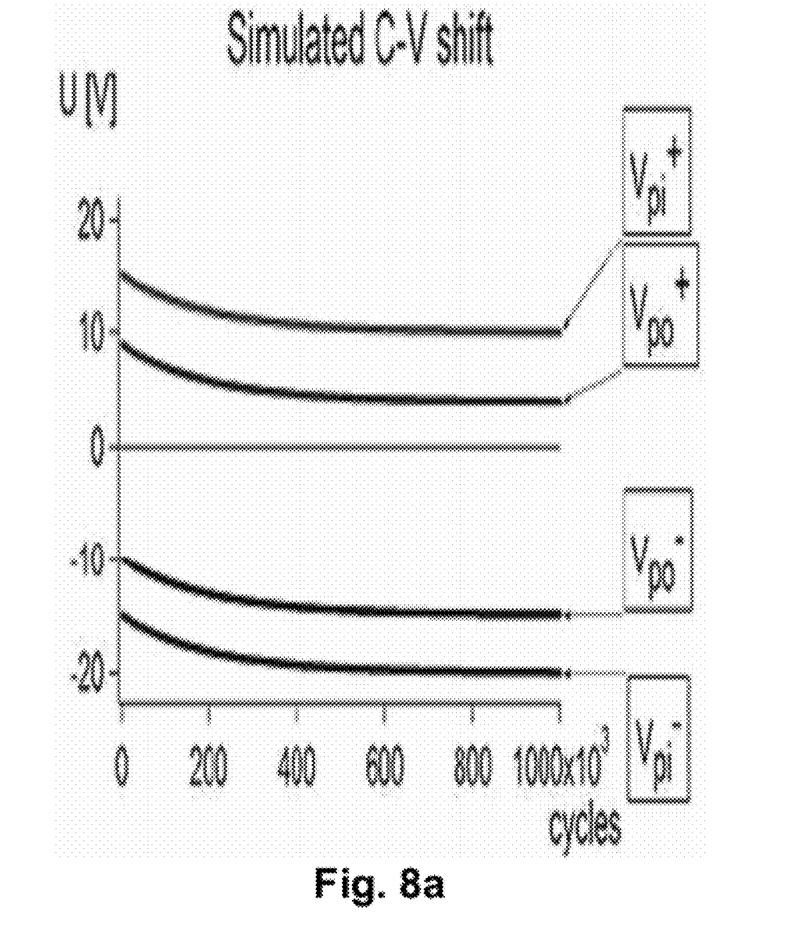
FIGS. 8*a-b* plot a shift of a C-V characteristic: simulated (FIG. 8*a*) and measured (FIG. 8*b*).
Figure 8B:
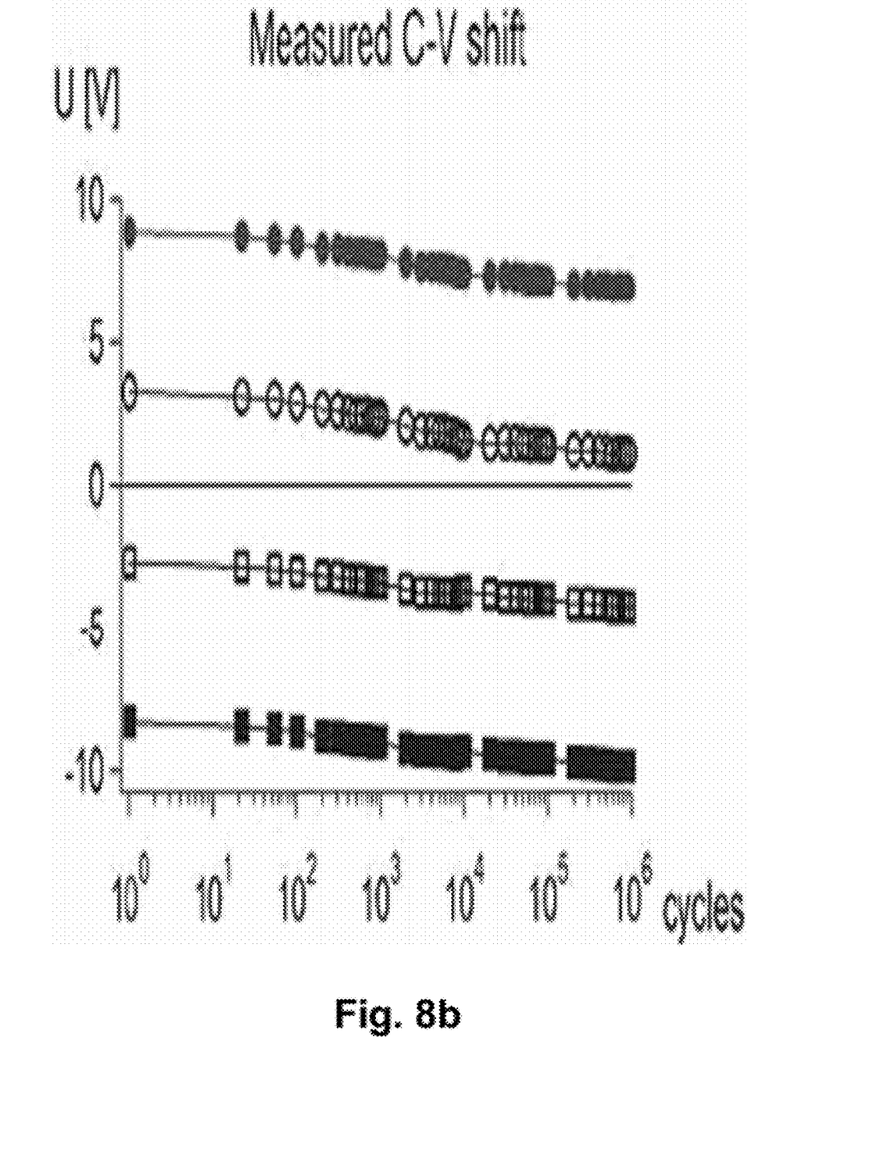

Recorded changes of $V_{pi}$ of a switch can be used to predict its lifetime but only if the model used for prediction is correct. There are several models proposed in the literature. One of the models attributes a shift of the C-V characteristic to uniform charge trapping. If that is the case, the C-V curve and related to that the pull-in and pull-out voltages should shift all in the same way in one direction. For positive charging, they should shift down, for negative charging they should shift upwards. This is simulated in FIG. 8, showing the measurement result of such a behavior. Another model says that there can also be a narrowing of the C-V characteristic and that this is caused by a distributed charge, when the net charge is zero. We showed using dedicated test structures that non-uniform charging of the interposer dielectric, and/or of the substrate indeed can cause such narrowing.

The invention claimed is:

1. An electrostatically actuatable micro electromechanical device comprising:
   a substrate of which at least a top layer comprises a dielectric material;
   a first conductor fixed to the top layer of the substrate, forming a fixed electrode of the device;
   a second conductor fixed to the top layer of the substrate, the second conductor being electrically isolated from the first conductor;
   a moveable electrode that is electrically connected with the second conductor and is suspended above the first conductor, such that the moveable portion approaches the fixed electrode upon application of an appropriate voltage difference between the first and second conductors; and
   at least one recess extending through at least the top layer of the substrate, wherein the recess is between the first and second conductors, and wherein the recess is under at least a portion of the moveable conductor.

2. A device according to claim 1, wherein:
   the surface of the substrate substantially defines a plane;
   an orthogonal projection of the moveable electrode on the plane, between the first and second conductors, defines a selected area of the substrate; and
   one or more of the recesses are provided in the selected area of the plane.

3. A device according to claim 2, wherein at least one of the recesses extends across at least the entirety of the selected area of the plane.

4. A device according to claim 1, wherein the moveable electrode has a width (W), and wherein one or more of the recesses span at least width (W) under the moveable electrode.

5. A device according to claim 2, wherein at least one of the recesses extends a distance (D2) beyond the selected area of the plane on at least one side of the selected area.

6. A device according to claim 5, wherein a length (L) extends between the first and second conductors, and the second distance (D2) is at least as great as the length (L).

7. A device according to claim 1, wherein the moveable electrode extends at a height (H) above the top layer of the substrate, and wherein each recess has a depth (D) of at least said height (H).

8. A device according to claim 1, wherein the moveable electrode is a cantilever element suspended by means of a single anchor.

9. A device according to claim 1, wherein the moveable electrode is a bridge element suspended between anchors on opposite sides of the first conductor.

10. A device according to claim 1, wherein the moveable electrode is a beam or membrane element fixed at minimal one anchor point, allowing toggling the beam or membrane.

11. A device according to claim 1, wherein the moveable electrode is an integral portion of the second conductor.

12. A method for manufacturing an electrostatically actuatable micro electromechanical device, wherein the method comprises:
(i) providing:
- a substrate of which at least a top layer comprises a dielectric material;
- a first conductor fixed to the top layer of the substrate, forming a fixed electrode of the device;
- a second conductor fixed to the top layer of the substrate, the second conductor being electrically isolated from the first conductor; and
- a moveable electrode electrically connected to the second conductor;
- wherein the surface of the substrate substantially defines a plane, and wherein an orthogonal projection of an intended position of the moveable electrode on the plane, between the first and second conductors, defines a selected area of the substrate; and (ii) etching at least one recess through at least the top layer of the substrate in the selected area of the substrate.

13. A method according to claim 12 in which at least part of the first and second conductors is used as a mask for etching at least one of the recesses.

14. A method according to claim 12, wherein the step of providing further comprises:
a) providing the substrate with a layer of conductive material on top,
b) providing a mask on top of the layer of conductive material for patterning
c) patterning the layer of conductive material to form the first and second conductors by means of an etching process which is subsequently also used for the step of etching the at least one recess.

* * * * *